(12) United States Patent
Rader

(10) Patent No.: US 6,370,581 B2
(45) Date of Patent: Apr. 9, 2002

(54) METHOD, APPARATUS, AND PRODUCT FOR TRANSMITTING MULTIBYTE CHARACTERS IN A NETWORK

(75) Inventor: Stuart Todd Rader, Menlo Park, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/090,414

(22) Filed: Jun. 4, 1998

(51) Int. Cl.$^7$ .................. G06F 15/16; H03M 7/00; H03M 7/14
(52) U.S. Cl. .............. 709/230; 709/236; 341/67; 341/95
(58) Field of Search ............... 709/230, 236, 709/203, 217, 246; 370/476; 341/63, 90, 67, 95; 712/300

(56) References Cited

U.S. PATENT DOCUMENTS

| | | | |
|---|---|---|---|
| 4,574,362 A | * 3/1986 | Spindel et al. | 341/60 |
| 5,337,233 A | * 8/1994 | Hofert et al. | 707/540 |
| 5,682,158 A | * 10/1997 | Edberg | 341/90 |
| 5,701,451 A | 12/1997 | Rogers et al. | 395/600 |
| 5,832,507 A | 11/1998 | Harper et al. | |
| 5,963,155 A | * 10/1999 | Cheng et al. | 341/90 |
| 6,049,869 A | * 4/2000 | Pickhardt et al. | 712/300 |

FOREIGN PATENT DOCUMENTS

EP   0 800 142 A1   10/1997

OTHER PUBLICATIONS

Burners–Lee et al., "Hypertext Transfer Protocol, HTTP/1.0"; Request for Comments 1945; May 1996, pp. 1–60.*
Davis, Mark, et al., "unicode" 1990 IEEE Proceedings of the International Conference on Systems, Man and Cybernetics, Nov. 1999, pp. 499–504.
Schendra, Harald, "Was ist eigentlich Unicode," Mikrocomputer–Technik, No. 6, Jun. 1998, p. 208.
Flanagan, David, Java In A Nutshell, Chapter 11: Internationalization, $2^{nd}$ Edition, 1997, pp. 201–208.
Ries, Eric, Chapter 16: Using Internationalization, ",Special Edition Using Java 1.1", ISBN#0789710943.

* cited by examiner

Primary Examiner—Mark H. Rinehart
Assistant Examiner—Marc D. Thompson
(74) Attorney, Agent, or Firm—Finnegan, Henderson, Farabow, Garrett & Dunner

(57) ABSTRACT

In accordance with the present invention a method and system for transmitting multibyte characters in a network comprises the steps, performed by a processor, of receiving a set of fixed-length characters; converting each fixed-length character into a multibyte character to determine a length corresponding to the multibyte characters; and transmitting the length and the multibyte characters.

12 Claims, 3 Drawing Sheets

METHOD, APPARATUS, AND PRODUCT FOR TRANSMITTING MULTIBYTE CHARACTERS IN A NETWORK

BACKGROUND OF THE INVENTION

A. Field of the Invention

Methods consistent with this invention generally relate to computer systems and, more particularly, to methods for transmitting multibyte characters in a network.

B. Description of the Related Art

The Internet is a composite network of networks that facilitates electronic communications between subscribers in virtually every corner of the globe. The World Wide Web (the "Web") is a sub-network of the Internet organized to enable users to locate stored information. In general, the Web enables two computers, one called a "client" and the other a "server," to communicate through Internet connections using a hypertext transfer protocol (HTTP). The client executes a "Web browser," or specialized software program, that allows the user to obtain information in the form of "Web pages" from the server. Developers utilize a software language referred to as the hypertext mark-up language (HTML) to create these web pages.

Many existing application programs allow users to take advantage of information on the Internet. Hotjava Views™, for example, is a suite of application programs that provides users with e-mail, calendaring, name directory access, and Internet browsing capabilities all written in Java™ programming language from Sun Microsystems, Inc. NameView™ is an application program that enables users to view a name directory provided by an application within HotJava Views or downloaded from an existing directory database. The Java programming language is an object-oriented programming language that is described, for example, in a text entitled "The Java Language Specification" by James Gosling, Bill Joy, and Guy Steele, Addison-Wesley, 1996. Sun, Sun Microsystems, the Sun Logo, NameView, HotJava Views, and Java are trademarks or registered trademarks of Sun Microsystems, Inc. in the United States and other countries.

NameView users can search directory databases of information on a local server or other web servers connected to the Internet. To access a web server and obtain information using applications like NameView, a user enters information into an input form called a "request." A Common Gateway Interface (CGI) script is an application that receives information from the user and puts the requested information into HTTP format for transmission across the Internet. CGI is a standard protocol for exchanging information between servers and applications external to the server, such as those on a client. When the client passes the CGI script and HTTP request, the receiving web server executes the CGI script and sends the information specified by the request back to the client.

In some cases, the HTTP request is first encapsulated using a protocol such as "MIME," which is a standard protocol for multi-media e-mail messages. The MIME protocol encapsulates the request in a file for transport and appends a header to an encoded form of the file. The header specifies certain information, such as the encoding method used, and requests the server to run a CGI script.

The globalization of the Internet has created a need for application programs that can operate in any location and using a wide variety of languages. Users in the United States may want to use applications such as NameView to search for the e-mail address of a friend in Japan. The directory database containing this information may be stored using the Japanese language and digital representations of Japanese characters. Languages with many different characters may be encoded using Unicode character encoding. Unicode is a 16-bit character coding system established by the Unicode Consortium. In Unicode, each character is represented by two bytes of digital information. In the American Standard Code for Information Interchange (ASCII) format, however, each character is represented by seven bits of digital code. English and other languages with a limited character set typically use the ASCII encoding format with each character represented by one byte, or eight bits of data.

Although an increasing number of software and hardware devices are manufactured for use with many different languages, many existing computer systems and application programs still support only 8-bit characters. As a result, transformation formats have been developed that translate characters into an 8-bit format. UTF-8 is an example of a variable-width or "multibyte" encoding format developed to support multilingual text. In UTF-8, standard ASCII characters are represented using only one byte that begins with a "0". Non-ASCII characters, however, require two or even three bytes. The first byte of a UTF-8 multibyte character indicates the total number of bytes in the character. For example, the first byte of a two-byte character has high-order bits "110" and the first byte of a three-byte character begins with "1110". All other bytes of a multibyte character begin with "10".

Multibyte character encoding systems, like UTF-8, require fewer bits to store and transport, but present difficulties for some applications. One reason is that web servers use the length of the data string in processing the HTTP request. Applications that formulate HTTP requests typically perform a standard function that determines the length. Standard functions, however, typically assume that the string contains only ASCII-encoded information and that the data string length is equal to the message length which is true with strings encoded using standard ASCII characters. With variable-length UTF-8 encoded strings, however, the number of bytes in the transmitted data string will often be different than the message length. Standard functions, therefore, return an incorrect length which creates errors in processing at the web server.

Therefore, a need exists for a method of transmitting multibyte characters in a network that communicates to the server an accurate data string length even when using variable-length encoding schemes like UTF-8.

SUMMARY OF THE INVENTION

A method for transmitting data in a network consistent with the present invention comprises the steps, performed by a processor, of receiving a set of fixed-length characters; converting each fixed-length character into a multibyte character to determine a length corresponding to the multibyte characters; and transmitting the length and the multibyte characters.

In accordance with the present invention, as embodied and broadly described herein, an apparatus for transmitting data in a network comprises a receiver configured to receive a set of fixed-length characters; a converter configured to convert each fixed-length character into a multibyte character to determine a length corresponding to the multibyte characters; and a transmitter configured to transmit the length and the multibyte characters.

In accordance with another aspect of the present invention, as embodied and broadly described herein, a computer program product comprises a computer-usable medium having computable readable code embodied therein for transmitting data in a network, the computer program product comprising the steps, performed by a processor, of receiving a set of fixed-length; converting each fixed-length character into a multibyte character to determine a length corresponding to the multibyte characters; and transmitting the length and the multibyte characters.

In accordance with still another aspect of the present invention, as embodied and broadly described herein, a system for transmitting data in a network comprises means for receiving a set of fixed-length characters; means for converting each fixed-length character into a multibyte character to determine a length corresponding to the multibyte characters; and means for transmitting the length and the multibyte characters.

BRIEF DESCRIPTION OF THE DRAWINGS

The accompanying drawings, which are incorporated in and constitute a part of this specification and, together with the description, serve to explain the advantages and principles of the invention.

DETAILED DESCRIPTION

A. Overview

Systems and methods consistent with the present invention enable transmission of a set of fixed-length characters as multibyte characters in a network. A set of fixed length characters is first converted into a string of multibyte characters. Each multibyte character is represented by a variable number of bytes. During the conversion process, a length of the multibyte character string is determined from the number of bytes in the multibyte character string. This length is transmitted across a network as part of a message header of a message containing the multibyte character string.

The present invention may be implemented using hardware, software or a combination of hardware and software. Specifically, the invention may be implemented with both object-oriented programming languages, like Java and C++, and nonobject-oriented programming languages.

Reference will now be made in detail to an exemplary implementation of a system consistent with the present invention which is also illustrated in the accompanying drawings. The description includes exemplary embodiments, other embodiments are possible, and changes may be made to the implementation described without departing from the spirit and scope of the invention. Wherever possible, the same reference numbers will be used throughout the drawings to refer to the same or like parts.

B. Computer Architecture

Figure 1:
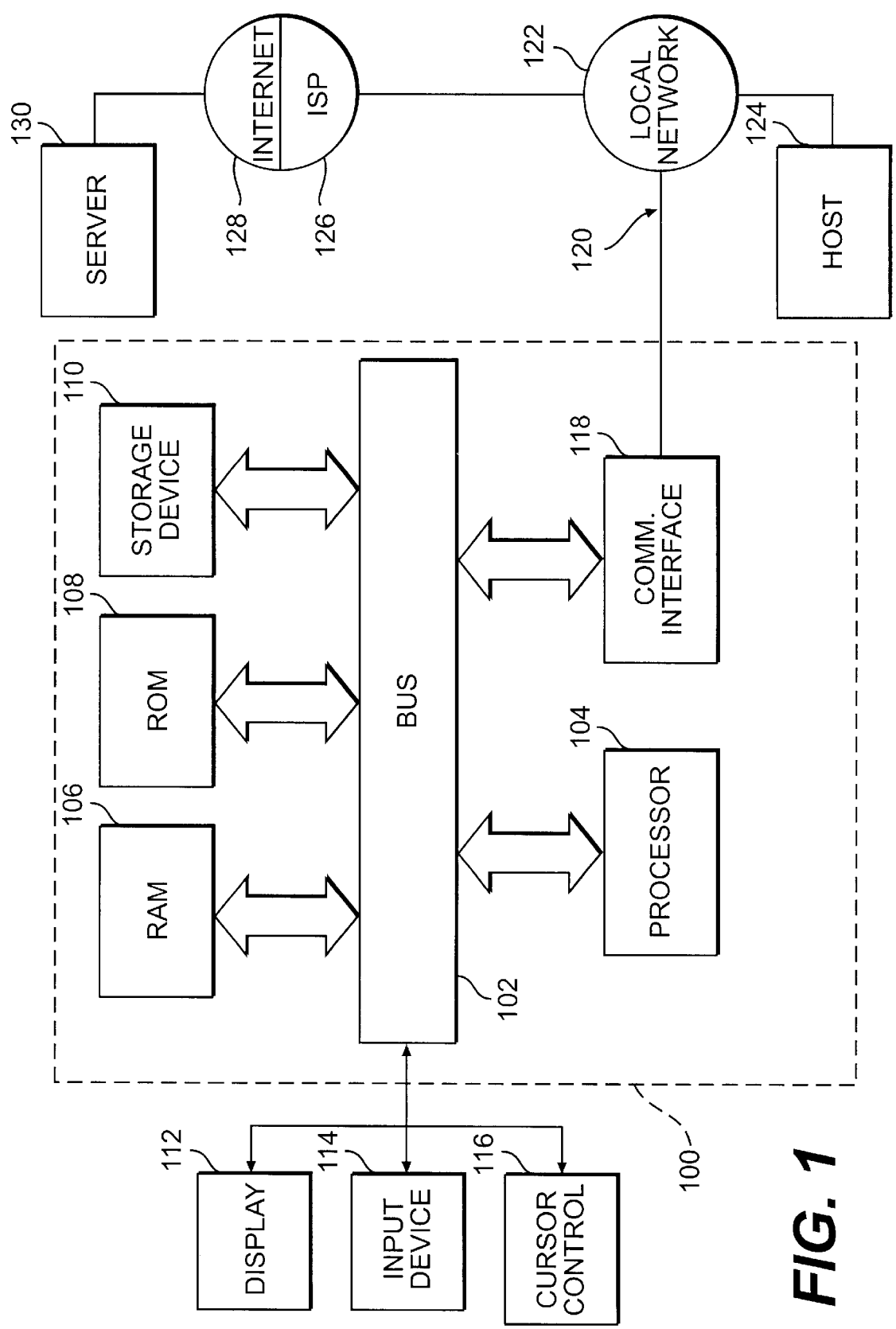
FIG. 1 is a schematic block diagram illustrating a computer architecture suitable for use with the present invention.

Methods and systems consistent with the present invention operate in distributed systems comprised of, for example, multiple homogenous or heterogenous machines. An exemplary distributed system 10 is shown in FIG. 1. Client 100 is a conventional computer that comprises a bus 102 or other communication mechanism for communicating information, and a processor 104 coupled with bus 102 for processing information and executing application programs. Client 100 also comprises a main memory, such as a random access memory (RAM) 106 or other dynamic storage device, coupled to bus 102 for storing information and instructions to be executed by processor 104. RAM 106 also may be used for storing temporary variables or other intermediate information during execution of instructions to be executed by processor 104. Client 100 further comprises a read only memory (ROM) 108 or other static storage device coupled to bus 102 for storing static information and instructions for processor 104. A storage device 110, such as a magnetic disk or optical disk, is provided and coupled to bus 102 for storing information and instructions.

Client 100 may be coupled via bus 102 to a display 112, such as a cathode ray tube (CRT), for displaying information to a computer user. An input device 114, including alphanumeric and other keys, is coupled to bus 102 for communicating information and command selections to processor 104. Another type of user input device is cursor control 116, such as a mouse, a trackball or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane.

Methods and systems consistent with the present invention utilize client 100 for transmitting multibyte characters in a network. Consistent with one implementation, processor 104 of client 100 executes one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. In an alternative implementation, hard-wired circuitry may be used in place of or in combination with software instructions to implement the invention. Thus implementations of the invention are not limited to any specific combination of hardware circuitry and software.

The term "computer-readable medium" as used herein refers to any media that participates in providing instructions to processor 104 for execution. Such a medium may take many forms, including but not limited to, non-volatile media, volatile media, and transmission media. Non-volatile media includes, for example, optical or magnetic disks, such as storage device 110. Volatile media includes dynamic memory, such as main memory 106. Transmission media includes coaxial cables, copper wire, and fiber optics, including the wires that comprise bus 102. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punch cards, papertape, any other physical medium with patterns of holes, a RAM, PROM, and EPROM, a FLASH-EPROM, any other memory chip or cartridge, a carrier wave, or any other medium from which a computer can read.

Various forms of computer readable media may be involved in carrying one or more sequences of one or more instructions to processor 104 for execution. For example, the instructions may initially be carried on magnetic disk of a remote computer. The remote computer can load the instructions into its dynamic memory and send the instructions over a telephone line using a modem. A modem local to client 100 can receive the data on the telephone line and use an infra-red transmitter to convert the data to an infra-red signal. An infra-red detector coupled to bus 102 can receive the data carried in the infra-red signal and place the data on bus 102. Bus 102 carries the data to main memory 106, from which processor 104 retrieves and executes the instructions. The instructions received by main memory 106 may optionally be stored on storage device 110 either before or after execution by processor 104.

Client 100 also comprises a communication interface 118 coupled to bus 102.

Communication interface 118 provides a two-way data communication coupling to a network link 120 that is connected to local network 122. For example, communication interface 118 may be an integrated services digital network (ISDN) card or a modem to provide a data communication connection to a corresponding type of telephone line. As another example, communication interface 118 may be a local area network (LAN) card provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 and/or to data equipment operated by an Internet Service Provider (ISP) 126. ISP 126 in turn provides data communication services through the Internet 128. Local network 122 and Internet 128 both use electric, electromagnetic, or optical signals that carry digital data streams. The signals through the various networks and the signals on network link 120 and through communication interface 118, which carry the digital data to and from client 100, are exemplary forms of carrier waves transporting the information.

Client 100 can send messages and receive data, including program code, through the network(s), network link 120 and communication interface 118. In the Internet example, a server 130 might transmit a requested code for an application program through Internet 128, ISP 126, local network 122 and communication interface 118. In accordance with one implementation, one such downloaded application determines the length of a string of multibyte characters and transmits them in a network, as described herein. The received code may be executed by processor 104 as it is received, and/or stored in storage device 110, or other non-volatile storage for later execution. In this manner, client 100 may obtain application code in the form of a carrier wave.

Although client 100 is shown in FIG. 1 as being connect able to one server 130, those skilled in the art will recognize that client 100 may establish connections to multiple servers on Internet 128.

Figure 2:
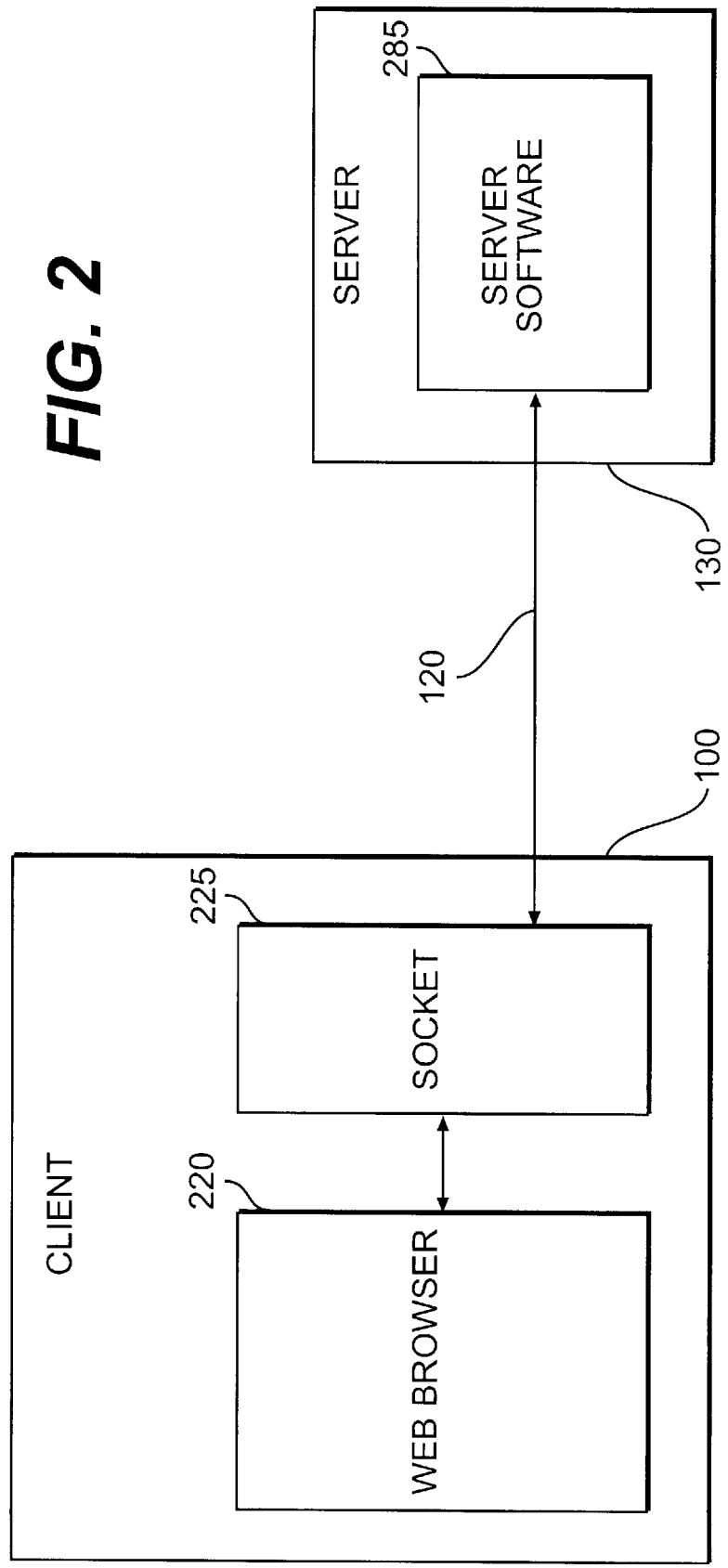
FIG. 2 is a pictorial representation of a method consistent with the present invention.

FIG. 2 illustrates the operation of application programs consistent with the present invention. Web browser 220 is a software program that typically displays information to the user which may be, for example, a form with blank data areas. Web browser 220 receives inputted information from the user and converts the inputted information into a data string for communication over the network to a server. HTTP is one example of a data format suitable for communication in a network.

To send an HTTP request, web browser 220 passes the data string to socket 225, which is an application program that acts as a communications interface between web browser 220 and the transport protocol of network link 120. The network transfer protocol may be, for example, TCP/IP. Socket 225 transmits the HTTP request across network link 120 to server 130. Server software 285 receives the HTTP request and retrieves the requested information.

C. Software Process

Figure 3:
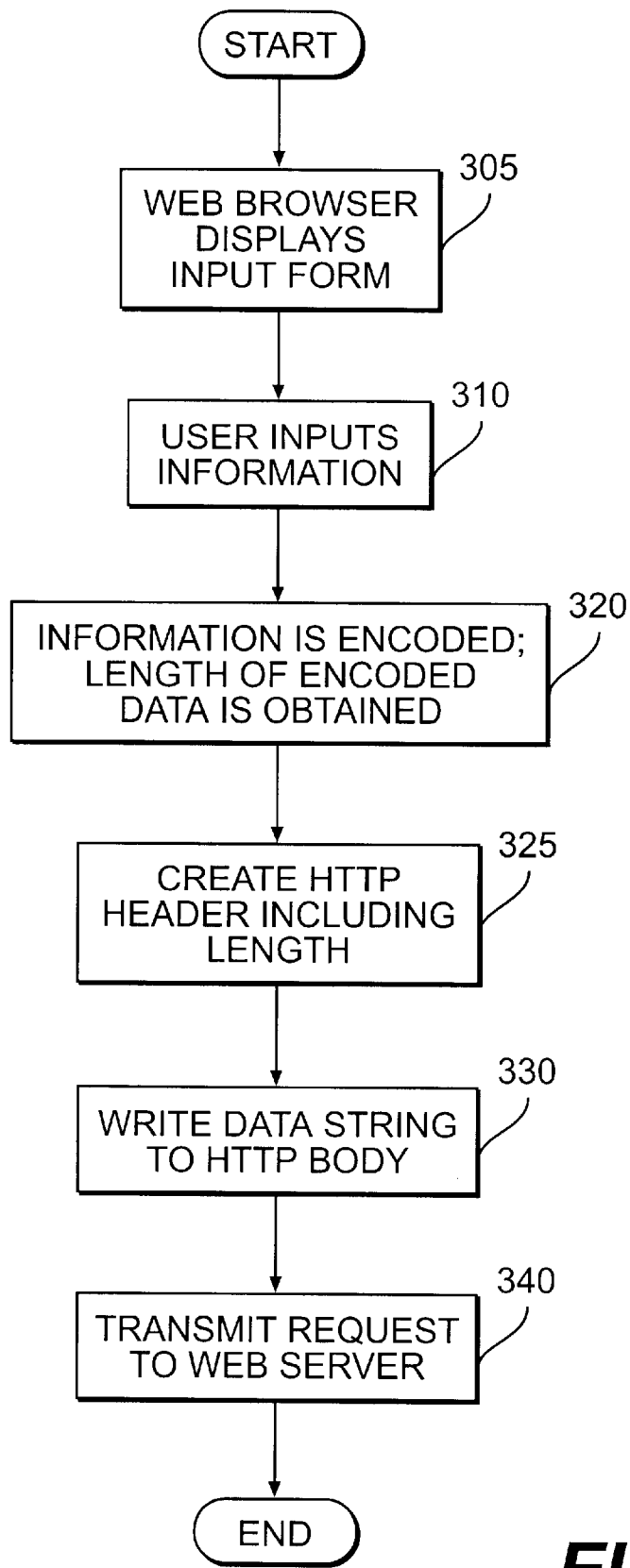
FIG. 3 is a flowchart of the steps performed by the processor consistent with the present invention.

FIG. 3 includes a flow chart of steps incorporated in web browser 220 to transmit multibyte characters in a network. The process begins with web browser 220 as shown in FIG. 2. To begin, web browser 220 displays an input form (step 305). The user inputs information using input device 114 that will be transmitted across the network (step 310). Using the example of the NameView application described above, a user in Japan may input, for example, the name of someone whose profile they wish to find in directory database 280 residing on server 130. The user enters the name using standard Japanese characters. The content of the input form is preformatted except for the information provided by the user. When the user indicates that the input form has been completed by, for example, "clicking" on a button displayed on the screen, web browser 220 captures the information entered by the user and encodes the inputted information in digital form using a standard encoding format. Depending on the location and language of the user, the inputted information may be encoded into a 16-bit character coding system such as Unicode (step 320). The result is a data string representing the inputted information in digital format.

To create an HTTP request in UTF-8 format, web browser 220 will convert the data string from its current format to UTF-8 and transmit the UTF-8 data string and an HTTP request header across the network. An HTTP request header typically contains information that server 130 requires to accurately parse the accompanying data string into bytes to understand the HTTP request. Valid HTTP headers include, for example, the content type of the output stream, expiration date notifying the browser when the attached document is no longer valid, and the length in bytes of the accompanying data string.

One method of obtaining the message length is to execute an application that converts the data string to UTF-8 encoded characters. Standard programs for converting to UTF-8 characters keep track of the message length as the string is being converted. Actual message length, however, is not available until the entire string has been converted. In implementations consistent with the present invention, therefore, the UTF-8 conversion is performed once prior to writing the string to the socket (step 320). The UTF-8 format conversion process returns a variable indicating the length of the multibyte data string (step 320). Web browser 220 creates an HTTP request header that includes the length of the multibyte data string (step 325). The data string is then written to the body of the HTTP request using, for example, a write method that converts to UTF-8 format. (step 330). Finally, the HTTP request header and accompanying multibyte data string is transmitted to server 130 (step 340). Web browser 220 may also encapsulate the HTTP request header and accompanying multibyte data string in an object-oriented program and send the program across the network connection.

D. Conclusion

In accordance with the present invention, an application implementing the method can transmit multibyte characters in a network. The application converts a set of fixed-length characters to UTF-8 format to obtain a length. The message length is used as an input variable in the HTTP request header and transmitted to the web server with the multibyte character string.

The foregoing description of an implementation of the invention has been presented for purposes of illustration and description. It is not exhaustive and does not limit the invention to the precise form disclosed. Modifications and variations are possible in light of the above teachings or may be acquired from practicing of the invention. For example, the described implementation includes software but the present invention may be implemented as a combination of hardware and software or hardware alone. The scope of the invention is defined by the claims and their equivalents.

I claim:

1. A method for transmitting data in a network comprising a client and a server, comprising the steps, performed by the client, of:

receiving a first message comprising a first set of characters encoded in a fixed-byte format, wherein each character is represented by the same number of bytes;

determining a second message comprising a second set of characters by converting each character in the first message from the fixed-byte format into a multibyte format, wherein each character in the second message is represented by one or more bytes depending on the character;

obtaining an actual length of the second message in the multibyte format; and transmitting to the server the actual length with the second message in multibyte format.

2. The method of claim 1, wherein the step of determining further comprises:

converting each character in the first message from the fixed-byte format into an UTF-8 encoding format.

3. The method of claim 2, wherein the step of transmitting to the server the actual length further includes:

transmitting the actual length with the second message in multibyte format in an HTTP request.

4. An apparatus for transmitting data in a network between a client and a server, comprising:

a receiver configured to receive a first message comprising a first set of characters encoded in a fixed-byte format, wherein each character is represented by the same number of bytes;

a processor configured to determine a second message comprising a second set of characters by converting each character in the first message from the fixed-byte format into a multibyte format, wherein each character in the second message is represented by one or more bytes depending on the character and obtain an actual length of the second message in the multibyte format; and a transmitter configured to transmit the actual length with the second message in multibyte format.

5. The apparatus of claim 4, wherein the processor is further configured to:

convert each character in the first message from the fixed-byte format into an UTF-8 encoding format.

6. The apparatus of claim 5, wherein the transmitter is further configured to:

transmit the actual length with the second message in multibyte format in an HTTP request.

7. A computer-readable medium capable of causing a client computer in a network comprising a server and the client computer to perform a method on the client computer, the method comprising the steps of:

receiving a first message comprising a first set of characters encoded in a fixed-byte format, wherein each character is represented by the same number of bytes;

determining a second message comprising a second set of characters by converting each character in the first message from the fixed-byte format into a multibyte format, wherein each character in the second message is represented by one or more bytes depending on the character;

obtaining an actual length of the second message in the multibyte format; and transmitting to the server the actual length with the second message in multibyte format.

8. The medium of claim 7, wherein the step of determining further comprises:

converting each character in the first message from the fixed-byte format into an UTF-8 encoding format.

9. The medium of claim 8, wherein the step of transmitting to the server the actual length further includes:

transmitting the actual length with the second message in multibyte format in an HTTP request.

10. A system for transmitting data in a network comprising a client and a server, comprising:

means for receiving at the client a first message comprising a first set of characters encoded in a fixed-byte format, wherein each character is represented by the same number of bytes;

means for determining at the client a second message comprising a second set of characters by converting each character in the first message from the fixed-byte format into a multibyte format, wherein each character in the second message is represented by one or more bytes depending on the character;

means for obtaining an actual length of the second message in the multibyte format; and means for transmitting to the server the actual length with the second message in multibyte format.

11. The system of claim 10, wherein the means for determining comprises:

means for converting each character in the first message from the fixed-byte format into an UTF-8 encoding format.

12. The system of claim 11, wherein the means for transmitting comprises:

means for transmitting the actual length with the second message in multibyte format in an HTTP request.

* * * * *